United States Patent [19]

Walters

[11] 4,181,387

[45] Jan. 1, 1980

[54] INTERCONNECT SOCKETS AND ASSEMBLIES

[75] Inventor: Jay A. Walters, Shreveport, La.

[73] Assignee: Western Electric Company, Inc., New York

[21] Appl. No.: 917,773

[22] Filed: Jun. 21, 1978

[51] Int. Cl.[2] .............................................. H05K 1/12

[52] U.S. Cl. .................................... 339/17 C; 29/626; 339/221 R; 339/275 B

[58] Field of Search ................. 339/17 R, 17 A, 17 B, 339/17 C, 220 R, 221 R, 221 M, 275 B; 29/625, 626

[56] References Cited

U.S. PATENT DOCUMENTS

| | | | |
|---|---|---|---|
| 2,640,903 | 6/1953 | Kohring | 339/221 R |
| 3,120,418 | 2/1964 | Deakin | 339/221 R |
| 3,187,298 | 6/1965 | Shannon | 339/17 R |
| 3,202,755 | 8/1965 | Oswald | 339/221 R |
| 3,428,934 | 2/1969 | Reider, Jr., et al. | 339/17 R |
| 3,573,707 | 4/1971 | Reynolds | 339/17 C |
| 3,681,738 | 8/1972 | Friend | 339/17 R |
| 3,710,196 | 1/1973 | Fifield | 29/626 |
| 3,975,072 | 8/1976 | Ammon | 339/17 LC |
| 3,992,076 | 11/1976 | Gluntz | 339/275 B |
| 4,024,629 | 5/1977 | Lemoine et al. | 29/625 |
| 4,050,772 | 9/1977 | Birnholz et al. | 339/220 R |

FOREIGN PATENT DOCUMENTS

| | | | |
|---|---|---|---|
| 1157683 | 11/1963 | Fed. Rep. of Germany | 339/17 R |
| 1336574 | 7/1963 | France | 339/17 R |

*Primary Examiner*—Neil Abrams

*Attorney, Agent, or Firm*—J. L. Landis

[57] ABSTRACT

Interconnect sockets (10) are assembled with substrates, such as printed circuit cards (12), to connect the leads (17) of electrical components (18) to conductive pads (14) deposited on the substrate. Each socket has an end section (19) inserted into a mounting hole (11) in the substrate, for gripping portions of the walls of the hole to mount the socket to the board; a midsection (13) for contacting the conductive pad; and a lead-engaging section (16) for gripping the component lead and connecting it to the pad through the socket. Preferably, the socket is a tubular member of a conductively plated spring metal, with spring members (20, 22, 30) for resiliently engaging the walls of the hole, the contact pad, and the lead. The sockets are especially useful with thermosetting conductive-particle/resin conductors, such as silver-epoxy or -acrylic resin "thick-film" conductive inks.

37 Claims, 10 Drawing Figures

FIG. 1
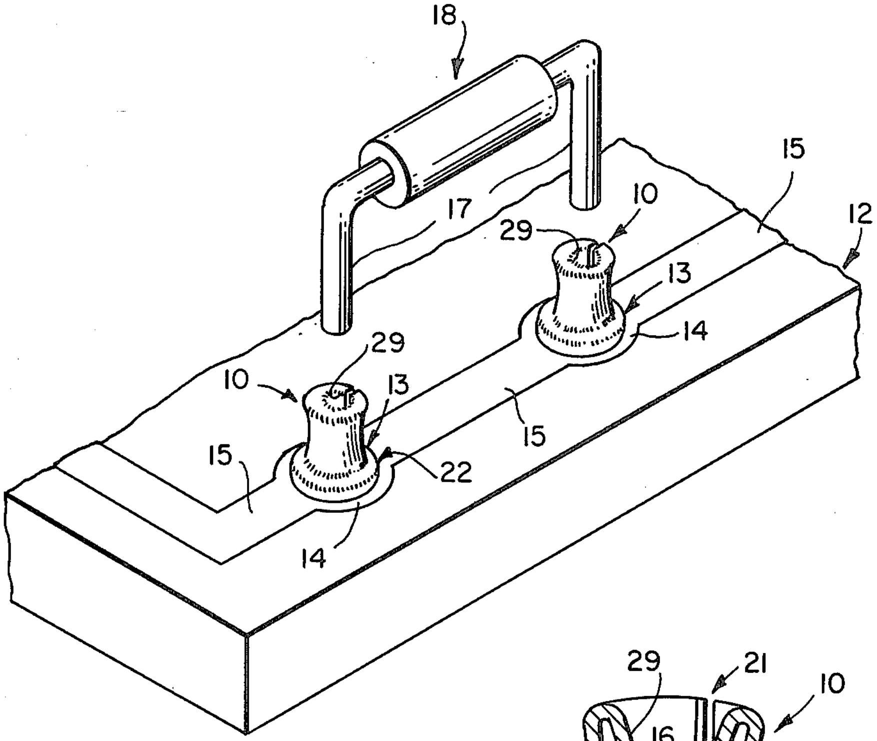
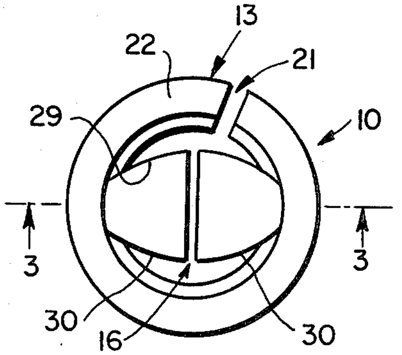
FIG. 2
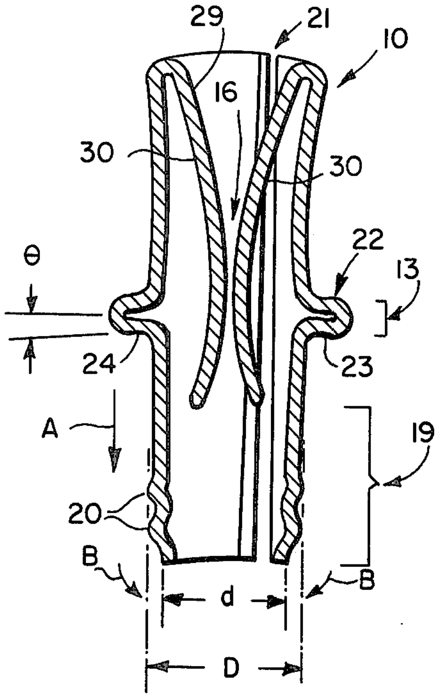
FIG. 3

INTERCONNECT SOCKETS AND ASSEMBLIES

INTRODUCTION AND BACKGROUND

This application relates generally to interconnect sockets such as are used with printed circuits to interconnect electrical components to the circuit conductors, and to assemblies of sockets with substrates.

In the past, interconnect sockets of this general type have been known, two examples being disclosed in Birnholz et al. U.S. Pat. No. 4,050,772 and Ammon U.S. Pat. No. 3,975,072, both herein incorporated by reference.

Objects of the present invention are to provide improved socket designs and assemblies, particularly with respect to:

(1) an improved, resilient mounting-section construction for fastening the socket in a mounting hole of a substrate, such as a printed circuit card;

(2) an improved contact section for resiliently contacting a conductive pattern on the surface of the substrate, to make electrical contact therewith;

(3) improved lead-engaging sections, for gripping and electrically contacting a component lead inserted into the socket;

(4) sockets which may readily be assembled with printed circuit contacts of the screened, metal-particle/thermosetting-resin type, and particularly forming secure socket-to-contact joints to provide secure gas-tight seals around the contacts;

(5) sockets which can be formed at very low cost from strip stock by conventional stamping and forming operations, and which are easy to assemble with the circuit cards;

(6) sockets which make electrical connection to the component-side surface of the circuit board and require no subsequent connection process, such as solder;

(7) sockets which can be mounted in an unplated, blind hole in a substrate, allowing the components and circuit to occupy the same substrate surface and not require thru holes.

SUMMARY OF THE INVENTION

With the foregoing and other objects in view, an interconnect socket in accordance with the invention is designed for assembly with a substrate, such as a printed circuit card, having a mounting hole in one surface thereof and having a conductive pattern, such as a "printed-circuit" contact pad, formed on the same surface in the vicinity of the hole. The socket is further designed to receive a lead of an electrical component, for providing electrical interconnection between the lead and the conductive pattern. The socket is a member formed at least in part of electrically conductive material and includes a mounting section, a contact midsection, and a lead-engaging section, each having certain features and interrelationships believes to be unique.

In accordance with certain features of the invention, the mounting section is adapted to be inserted into the hole and is provided with spring means for resiliently gripping portions of the walls of the hole when the mounting section is inserted into the hole, to fasten the socket in the hole by mechanical spring forces. The midsection is formed with contact means having a contact surface adapted to be positioned against the conductive pattern, for making electrical contact therewith when the mounting section of the socket is fastened in the hole. The lead-engaging section includes means for gripping and electrically contacting a component lead when the lead is inserted into the socket, to connect the lead to the conductive pattern through conductive portions of the socket member.

In accordance with certain features of the invention, the socket has a midsection including spring contact means for resiliently engaging a contact pad and making electrical contact therewith when the socket is fastened in the hole. Preferably, the socket comprises a generally tubular spring-metal body member, having a U-shaped annular flange extending outward from the periphery of the socket member, for resiliently engaging the conductive pattern on the substrate surface, and making electrical contact therewith when the socket is fastened in the hole. Preferably also, the contact surface of the socket is arranged at an angle to the conductive pattern arranged so that, on insertion of the socket into the hole, an outer peripheral edge of the contact surface first engages the conductive pattern as the socket is inserted, and then the contact leg pivots toward the substrate to a flat or near flat position fully engaging the contact pattern when the socket has been fully inserted in the hole.

In accordance with certain aspects of the invention, the socket is especially designed for use with printed circuits having conductive patterns of a material that is deformable at the time of socket insertion, such as a silver particle-thermosetting resin ink. In this example, the contact means is preferably arranged to compress the conductive pattern and thereby cause portions of the pattern material to flow inwardly toward the center of the hole, to provide good contact with the pattern and to provide a gas-tight seal between socket and hole. In this case, the printed-circuit conductors are preferably cured after the sockets have been inserted to bond the contact surface of the socket to the cured resin body. Preferably, the external surface of the socket is plated with a highly conductive material, such as silver or gold, to provide a metallurgical bond between the contact surface and the printed circuit pattern.

In accordance with other aspects of the invention, the mounting section comprises a generally C-shaped tubular, compressible spring-metal end section of the socket member. The outer dimensions of the end section are sufficiently greater than the dimensions of the hole that the end section can be inserted in the hole. When inserted, the tubular end section is compressed inwardly and spring forces are established in the compressed metal to mechanically fasten the socket in the hole. Preferably, the outer periphery of the end section is formed with rounded protrusions that engage the walls of the hole at spaced points therearound.

Other objects, advantages and features of the invention will appear from the following detailed description of specific embodiments thereof, when read in conjunction with the accompanying drawings.

Drawings

In the drawings,

FIG. 1 is a fragmentary perspective view illustrating a portion of a printed circuit assembled with a pair of connector sockets in accordance with a first embodiment of the invention, preparatory to inserting the leads of an electrical component into the sockets.

FIG. 2 is a top plan view of a connector socket in accordance with FIG. 1.

FIG. 3 is a vertical section along line 3—3 of FIG. 2.

DETAILED DESCRIPTION

First Embodiment—Construction and Assembly of Parts

Figure 4:
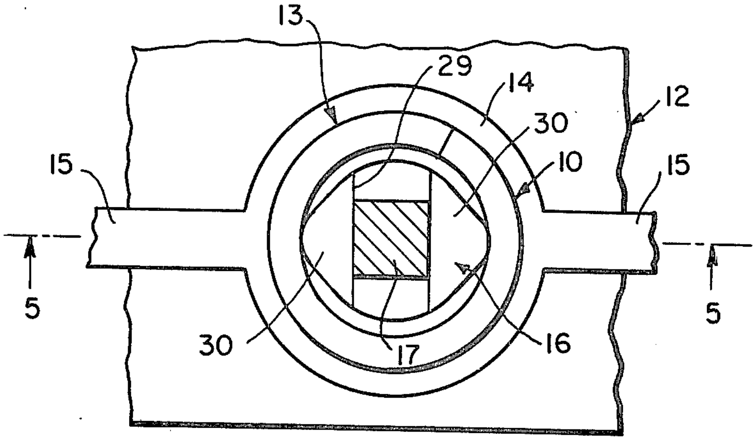
FIG. 4 is a top view similar to FIG. 2, illustrating the assembly of the socket with the printed circuit and a component lead, partially in horizontal section through the lead along line 4—4 of FIG. 5.
Figure 5:
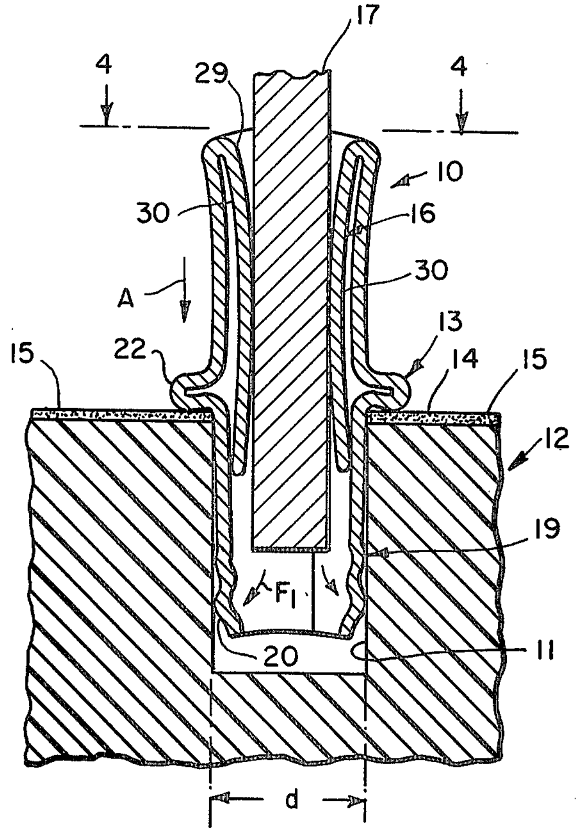
FIG. 5 is a vertical section of the assembly, along line 5—5 in FIG. 4 and corresponding to FIG. 3.

Referring now in detail to the drawings, and particularly to FIGS. 1 to 5, there is illustrated an interconnect element or socket 10 in accordance with a first specific embodiment of the invention. As illustrated in FIGS. 1 and 4–5, when assembled, each socket 10 is fastened within a mounting hole 11 (FIG. 5) in a substrate, such as a generally conventional printed circuit board or card 12, so that an outwardly extending contact section or midsection 13 of each socket member makes electrical contact with a conductive pattern, such as a "printed circuit" contact pad 14, formed or deposited on the upper surface of the card 12 in the area surrounding each hole 11. As is conventional, in this example, the contact pads 14—14 are connected by printed circuit conductors 15—15 deposited on the card 12 in a desired circuit pattern.

The sockets 10 are also formed with lead-engaging sections 16, into which terminal pins or leads 17 of an electrical component 18 (FIG. 1), such as a resistor, capacitor, semiconductive device or integrated circuit, are inserted for connection to the printed circuit patterns. Each lead-engaging section 16 includes means for gripping and electrically contacting an associated lead 17, and at least outer portions of the socket 10 extending between the contact section 13 and the lead-engaging section 16 are formed of electrically conductive material, so that each lead 17 is connected to a companion pad 14 through conductive portions of the socket member 10.

The socket 10 is also formed with a mounting section 19, adjacent the lower end thereof as viewed in FIGS. 3 and 5, adapted to be inserted in the hole 11 and having spring means for engaging and resiliently gripping portions of the walls of the hole 11 when the mounting section 19 is inserted into the hole, as indicated by arrow A in FIGS. 3 and 5. This fastens the socket 10 securely in the hole 11 by mechanical spring forces.

The socket member 10 is preferably formed from a thin strip of a spring metal, such as beryllium copper or phosphor bronze, preferably plated on its exterior surface (FIG. 3) with a highly conductive material, for example a noble metal such as silver, gold, or palladium, or alloy such as a silver-palladium alloy, to provide the required conductive paths from the leads 17 to the pads 14.

The strip is preferably blanked and formed into a generally cylindrical or tubular configuration, as illustrated in FIGS. 2 and 3, to form the socket body having a shape (cylindrical, rectangular, etc.) designed to fit into the particular shape of mounting hole 11 employed. In the example illustrated, using a cylindrical mounting hole 11, the lower-end mounting section 19 of the socket is preferably formed as a split cylindrical section, with a dimpled or crenated region near its lower end to provide a plurality of bulges or rounded protrusions 20 that engage the walls of the hole 11 at spaced points therearound, as illustrated in FIG. 5. Preferably, the protrusions 20 are formed as two spaced annular rings extending generally perpendicular to the direction of insertion (arrow A) as illustrated in FIGS. 2–3, although a series of spaced individual projections may also be used. The socket 10 is initially formed into a tubular configuration, defining a nearly complete C-shape as viewed from the top in FIG. 2, but leaving a small gap 21 that permits the lower end section to be compressed radially inward (arrows B—B in FIG. 3) as the mounting section 19 is inserted into the hole 11. As indicated in FIG. 3, the initial, uncompressed outer diameter (D) of the spring-metal mounting section 19 is a predetermined amount greater than the diameter (d) of the hole 11, such that the section 19 is compressed uniformly radially inward to a preset degree on insertion of the socket 10, and so that uniform radially outward spring forces $F_1$ (FIG. 5) are established in the compressed metal of the section 19 to mechanically fasten or lock the socket 10 in the hole 11 with a desired spring-holding force. The lower end of the section 19 is tapered inwardly, as shown in FIGS. 3 and 5, to facilitate initial seating and centering of the socket 10 with respect to the hole 11 as the socket is inserted in the hole, per arrow A, to assemble the parts.

In cases where the mounting hole 11 is a shape other than cylindrical, the mounting section 19 is shaped correspondingly to fit and be latched in the hole; for example, a rectangular socket is used with rectangular mounting holes.

In accordance with certain aspects of the invention, the contact section 13 includes spring metal portions, such as a contact ring or flange 22, extending outward from the periphery of the socket member 10 and having a contact surface 23 (FIG. 3) for resiliently engaging the conductive pattern or pad 14 and making electrical contact therewith when the socket 10 is fastened in the hole 11. In the preferred embodiment illustrated in FIGS. 2–3, the contact section 13 is formed as a generally U-shaped (FIG. 3) annular flange 22 or ring extending around the periphery of the socket 10. In this embodiment, the contact surface 23 is the under surface (FIG. 3) of a resilient, lower contact leg 24 of the flange, which engages the surface of the pad 14 when the parts are fully assembled as viewed in FIG. 5. Instead of a continuous ring or flange 22, a plurality of spaced, radially extending tabs could also be used to form the contact section 13.

Figure 6:
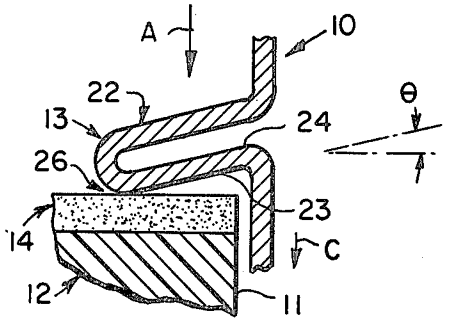
FIGS. 6–7 are enlarged, slightly exaggerated sectional views, similar to a portion of FIG. 5 and illustrating sequential steps in the assembly of the socket and circuit card.

In the preferred embodiment illustrated, in the "socket insert" attitude of FIGS. 3 and 5, the contact surface 23 of the lower flange leg 24 is preferably formed at an outwardly and downwardly tapering angle $\theta$ (FIGS. 3 and 6) to the upper surface of the contact pad 14, such as 5° in a typical example. With this arrangement, as illustrated in somewhat exaggerated fashion in FIGS. 6–7, as the socket 10 is inserted into the hole 11 (arrow A), an outer peripheral edge 26 of the contact surface 23 first engages the pad 14, as illustrated in FIG. 6. Thereafter, upon continued application of socket-insertion force, the lower leg 24 pivots downward (arrow C) toward the substrate 12 to the nearly or "substantially" flat, fully-assembled position illustrated in FIGS. 7 and 5, in which the under surface 23 of the flange 22 fully engages and makes firm electrical contact with the upper surface of the pad 14. Typically, the contact surface 23 remains inclined at a small angle after insertion, such as 2°, smaller than the pre-insertion angle $\theta$. When this is done, spring forces $F_2$ (FIG. 7) are set up in the bent flange 22 tending to return it to the initial attitude of FIGS. 3 and 6; however, the spring-locking section 19 of the socket 10 is so formed that the locking forces $F_1$ set up in the section 19, upon insertion, are sufficiently strong to prevent return of the contact flange 22 to its initial, unbent position. Also, as will be discussed in further detail hereafter, the locking forces $F_1$ are preferably set so that the components 18 may be repeatedly inserted into the sockets 10 and removed, without affecting the lock between socket and substrate 12.

In accordance with preferred embodiments of the invention, the contact pads 14 and printed circuit conductors 15 are composed of a conductive "thick-film" material, such as a mixture of conductive metal particles dispersed in a heat-curable thermosetting resin base; for example, a generally conventional "silver-resin ink" or "paste," consisting of 70% by weight silver particles in an epoxy or acrylic resin base, which is applied to the printed circuit card 12 by conventional "silk-screening" techniques. Preferably, the sockets 10 are mounted in the holes after the ink pads 14 and associated conductors 15 have been screened onto the card 12, but before the resin has been cured and while the ink is still deformable, or plastic and flowable.

Figure 7:
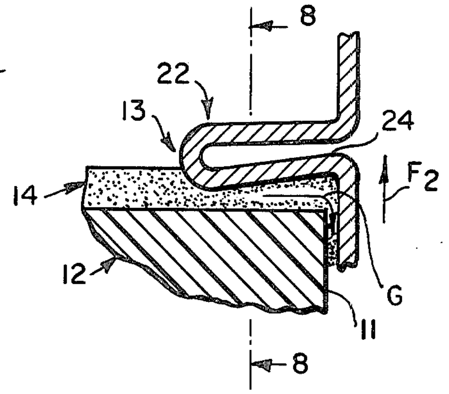

With this arrangement, and particularly with the inclined configuration of the flange leg 24 shown in exaggerated fashion in FIGS. 6–7, as the lower leg 24 is pivoted downward from the FIG. 6 position to that of FIG. 7, the leg 24 compresses the plastic ink somewhat and causes a limited flow of the ink radially inwardly toward the center of the hole 11, from left to right in FIG. 7 according to arrow G. By thus compressing the ink pad 14 and causing portions to flow radially inwardly, a good, maximum surface-area electrical contact is achieved between the contact surface 23 of the socket 10 and the printed circuit pad 14 and to provide a gas-tight seal around the socket. Also, the inward ink flow tends to avoid the formation of "shorts" to adjacent printed conductors, in the process.

Figure 8:
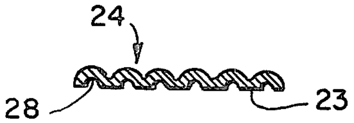
FIG. 8 is a vertical section through a portion of a contact section of the socket, taken generally along line 8—8 of FIG. 7.

The lower leg 24 of the flange 22 is preferably also formed with a scalloped or crenated cross section, as illustrated in FIG. 8, defining parallel channels 28 or grooves along the contact surface 23 for engaging the pliable pad 14 and thereby increasing the contact surface area as the surface 23 is pressed down and the pad material fills the channels 28, and for permitting flow of the plastic pad material radially inwardly along the channels according to arrow G in FIG. 7.

As previously mentioned, the contact surface 23 (and normally the entire external surface of the socket) is plated with a highly conductive metal, such as silver, gold, palladium, or silver-palladium alloy, so as to provide a low contact resistance and to form a metallurgical bond with the metal of the pads 14, when the pads and conductors 15 are subsequently heated to cure the thermosetting resin base. After curing of the resin, the flange surface 23 is bonded or "glued" to the pad material 14, particularly when epoxy-based inks are used. This provides additional holding force to retain the socket 10 in the hole 11, although the spring-holding force of the end section 19 alone is sufficient to lock the sockets in the board.

After all of the sockets 10 have been mounted in the board 12 and the circuit conductors 15 and contact pads 14 cured, the leads 17 of the circuit components 18 may be inserted into tapered entrance apertures 29 at the upper ends of the sockets 10 in generally conventional fashion. In the first embodiment, illustrated in FIGS. 2–5, the lead-engaging section 16 comprises a pair of opposed, bowed spring fingers 30—30 that are deflected outward when the leads 17 are inserted, as shown in FIGS. 4–5, to grip and make electrical contact with component leads 17 of various standard sizes and shapes.

One general advantage of the connector socket arrangement, such as the elements 10, is that components 18 can easily be inserted and removed, for replacement or repair, several times if necessary, and there is no need to solder or otherwise permanently connect the leads 17 to the conductors on the board. As previously mentioned, the holding force $F_1$ of the sockets 10 in the holes 11 is sufficiently larger than the spring-holding forces between the fingers 30 and the leads 17 that the components can be removed without disturbing the sockets 10.

Another advantage to the socket configuration illustrated is that the leads 17 need not be precisely aligned with the sockets 10 or be 100% perpendicular to the sockets, as the spring fingers 30 will accommodate a considerable amount of misalignment, while still adequately gripping the leads.

Second Embodiment

Figure 10:
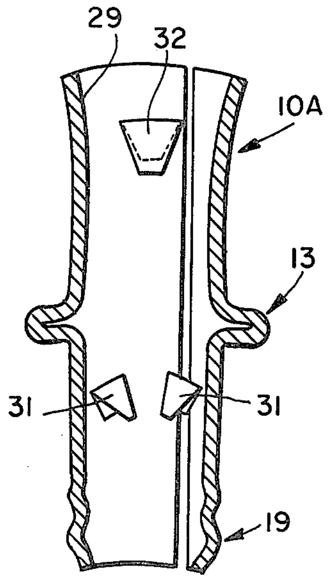
FIGS. 9–10 are views corresponding to FIGS. 2–3 and illustrating a second embodiment of the socket.
Figure 9:
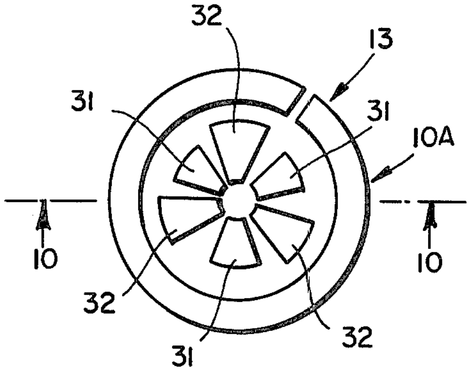

In accordance with a second embodiment, illustrated in FIGS. 9, 10, a modified socket 10A is illustrated, that is essentially the same as the one just described, except that the lead-engaging sections comprise two sets of three punched, inwardly extending spring metal tangs or tabs 31 and 32. A lower row of three tabs 31—31 is spaced at 120° angles, as illustrated in FIGS. 9–10, while an upper row of three tabs 32—32 is spaced at 120° angles, equally spaced between the positions of the lower tabs 31.

With this arrangement, the six tabs 31–32 deflect and grip a component lead on insertion, by deformation of the tabs. This embodiment provides higher gripping forces, resulting in somewhat more positive electrical interconnection with the lead, but insertion and removal forces are less easily controlled than in the first embodiment.

EXAMPLE

In accordance with a specific preferred example of the invention, the following materials are used:

(A) Circuit card 12:

Molded polycarbonate substrate thickness—150 mils (approx. 3.8 mm)

blind holes 11—depth—100 mils (approx. 2.5 mm)

blind holes 11—diameter (d)—40 mils (approx. 1.0 mm).

(B) Printed circuit pads 14 and conductors 15:

Epoxy ink containing 70% by weight silver particles, such as "ABLEBOND 36-2," manufactured by Ablestik Laboratories of Gardena, Calif.

Cures at approximately 125° C., in one hour.

Thickness before curing—typical 3 mils (approx. 0.076 mm).

(C) Interconnect socket 10, shaped as shown in FIGS. 2–3 on a scale of approximately 20:1:

Material—phosphor bronze, copper alloy stock No. 511, spring temper.

thickness of stock—5 mils (approx. 0.13 mm)

length (top to bottom FIG. 3)—160 mils (approx. 4.1 mm)

outer diameter D of locking section 19—50 mils (approx. 1.3 mm)

outer diameter of contact section 13—80 mils (approx. 2.0 mm)

outer diameter at top (FIG. 3)—60 mils (approx. 1.5 mm).

The entire outer surface of the socket is plated with nickel, 0.10 mils minimum (0.0025 mm), followed by hard-gold plating, 0.030 mils minimum (0.00076 mm).

(D) Components 18:

A wide variety of dual or multileaded components can be received in the sockets 10 with these dimensions, the examples given above being particularly adapted for conventional pin or lead 17 sizes and shapes (round or square) from about 10 to 25 mils (approximately 0.25 to 0.65 mm).

Variations and Choice of Parameters

While various specific embodiments and examples of the invention have been described in detail above, it will be apparent that various modifications may be made from the specific details described, and examples given, without departing from the spirit and scope of the invention.

The foregoing example was designed for certain specific applications in digital switching circuitry for electronic telephone push-button dials, where low currents are employed, where screened thick-film metal-resin conductors may be used, and where volume resistivities of the order of 0.0001 ohm-cm, typical, are tolerable.

Preferably, molded thermoplastic materials, such as polycarbonates or polysulfones, are used for the cards 12, although obviously any substrate materials can be used. Unplated "blind holes" such as 11 are preferably used, although it should be apparent that plated and/or "through holes" can also be used in the process. In general, one major advantage to socket-type interconnects, such as 10, is that the holes need not be plated, and the contact between the socket 10 and the printed circuits 14–15 is only a mechanical/physical/adhesively bonded contact made at the surface of the substrate, thus eliminating the need for clinching, soldering or other types of metallurgical contact between the leads and the printed circuit conductors. Also, as discussed above, the components 18 may easily be removed from the sockets and replaced, since the leads are only releasably held in the sockets by the contact springs 30 (or tabs 31–32 of FIGS. 9–10).

Another major advantage of this type of interconnect 10 is that it may be used with blind holes such as 11, whereas through holes can lead to contamination of the under surface of the board 12, which normally is provided with additional printed circuitry. With this arrangement, through holes need be used only at those crosspoints where the "top" circuit must be connected to the "bottom" circuit.

Preferably, the sockets 10 are dimensioned, as viewed in FIGS. 4–5, so that the center of gravity of the socket is slightly below the surface of the substrate 12, which provides geometric stability of the socket mounting in the holes 11 by minimizing any tendency of the socket 10 to bend or pivot at the flange 22 to pad 14 interface. This socket stability contributes to facility in removing and replacing components and to insertion of components with slightly skewed or misaligned leads 17. The circumferentially dimpled holding section 19 in the preferred embodiment distributes the spring holding forces ($F_1$, FIG. 5) evenly in the hole 11 and minimizes plastic deformation of the substrate 12. As previously alluded to, these locking forces provide mechanical security for the interconnect 10, on component removal, rather than stressing the ink pad (14) to interconnect (surface 23) joint.

Further, this type of printed circuit using screened metal-resin conductors and interconnects 10 is relatively easy to manufacture and very low in cost, which will result in very low cost circuits where these technologies are applicable. The interconnects 10 of this design are relatively easy to fabricate in quantity with conventional stamping and forming presses, and relatively easy to insert in the holes, which results in a cost objective in volume of less than one cent per inserted interconnect.

I claim:

1. An interconnect socket having component parts capable of being assembled with a substrate having a mounting hole in a planar surface of the substrate and a conductive pattern having a planar outer surface formed on the same surface of the substrate in the vicinity of the hole, and capable of receiving a lead of an electrical component, for providing electrical interconnection between the lead and the conductive pattern, said interconnect socket being a member formed at least in part of electrically conductive material and comprising:

(a) a mounting section adapted to be inserted into the hole, the mounting section having spring means for resiliently gripping portions of the inner walls of the hole when the mounting section is inserted into the hole, to fasten the socket in the hole by mechanical spring forces;

(b) a midsection including spring contact means having a contact surface adapted to be positioned against the conductive pattern, for making electrical contact therewith when the mounting section of the socket is fastened in the hole, the contact means comprising spring metal portions extending outward from the periphery of the socket member and having generally planar contact surfaces for resiliently engaging the planar outer surface of the conductive pattern and making electrical contact with a substantial surface area portion thereof when the socket is fastened in the hole; and (c) a lead-engaging section into which the component lead is adapted to be inserted, the lead-engaging section having means for gripping and electrically contacting the lead when the lead is inserted into the socket, to connect the lead to the conductive pattern through conductive portions of the socket member.

2. An interconnect socket as recited in claim 1, wherein the contact means comprises a U-shaped annular flange extending around the periphery of the socket and having a resilient contact leg for engaging the conductive pattern.

3. An interconnect socket as recited in claim 2, wherein the contact leg of the U-shaped flange is arranged at an angle to the conductive pattern, on insertion of the socket into the hole, so that an outer peripheral edge of the contact surface first engages the conductive pattern as the socket is inserted, and then the contact leg pivots toward the substrate to a substantially flat position fully engaging the contact pattern when the socket has been fully inserted in the hole.

4. An interconnect socket as recited in claim 1, for use with substrates having conductive patterns of a material that is deformable at the time of socket insertion, wherein the contact means on insertion compresses the conductive pattern and causes portions of the pattern material to flow inwardly toward the center of the hole.

5. An interconnect socket as recited in claim 4, wherein the contact surface of the contact means is formed with parallel channels for receiving the material of the conductive pattern and permitting flow thereof along the contact means toward the center of the hole.

6. An interconnect socket as recited in claim 4, for use with a substrate having conductive patterns formed of a mixture of conductive particles dispersed in a heat-curable thermosetting resin base, the particle-resin mixture being initially applied as a flowable plastic paste and thereafter being heated to cure the resin base, wherein the socket is assembled with the substrate after the conductive paste has been applied and is flowable but before curing of the resin, and wherein the resin is cured after the socket has been inserted to bond the contact surface of the contact means to the surface of the conductive pattern.

7. An interconnect socket as recited in claim 6, for use with conductive patterns composed of silver particles in an epoxy or acrylic resin base, wherein at least the contact surface of the socket is plated with a noble metal or alloy.

8. An interconnect socket as recited in claim 1, wherein the mounting section comprises a generally C-shaped tubular, compressible spring-metal end section of the socket member, the outer dimensions of the end section being sufficiently greater than the dimensions of the hole that the end section can be inserted in the hole and, when inserted, the tubular end section is compressed inwardly and spring forces are established in the compressed metal to mechanically fasten the socket in the hole.

9. An interconnect socket as recited in claim 8, wherein the outer periphery of the end section is formed with a plurality of rounded protrusions adapted to engage the walls of the hole at spaced points therearound when the socket is inserted in the hole.

10. An interconnect socket as recited in claim 9, wherein the protrusions comprise at least two spaced parallel annular rings extending generally perpendicular to the direction of insertion of the socket into the hole.

11. An interconnect socket having component parts capable of being assembled with a printed circuit substrate having a mounting hole in a planar surface of the substrate and a contact pad having a planar outer surface deposited on the same surface of the substrate in the vicinity of the hole for providing electrical interconnection between the socket and the pad, the socket comprising:

a generally C-shaped tubular spring-metal body member having a compressible mounting end section adapted to be inserted into the hole and compressed thereby so that spring forces are established in the compressed metal to mechanically fasten the socket in the hole, the socket member further having a midsection including spring metal contact portions extending outward from the periphery of the socket member and having generally planar contact surfaces for resiliently engaging the planar outer surface of the contact pad and making electrical contact with a substantial surface area portion thereof when the socket is fastened in the hole.

12. An interconnect socket as recited in claim 11, for use with printed circuits having contact pads of a material that is deformable at the time of socket insertion, wherein, on insertion of the socket, the contact surface compresses the pad and causes portions of the pad material to flow inwardly toward the center of the hole.

13. An interconnect socket as recited in claim 12, wherein the midsection comprises a U-shaped annular flange extending around the periphery of the socket body and having a resilient contact leg for engaging the contact pad.

14. An interconnect socket as recited in claim 13, wherein the contact leg of the U-shaped flange is arranged at an angle to the conductive pad, on insertion of the socket into the hole, so that an outer peripheral edge of the contact surface first engages the conductive pattern as the socket is inserted, and then the contact leg pivots toward the substrate to a substantially flat position fully engaging the contact pad when the socket has been fully inserted in the hole.

15. An interconnect socket as recited in claim 12, wherein the contact surface of the midsection is formed with parallel channels for receiving the material of the conductive pad and permitting flow thereof along the contact surface toward the center of the hole.

16. An interconnect socket as recited in claim 12, for use with a substrate having contact pads formed of a mixture of conductive particles dispersed in a heat-curable thermosetting resin base, the particle-resin mixture being initially applied as a flowable plastic paste and thereafter being heated to cure the resin base, wherein the socket is assembled with the substrate after the conductive paste has been applied and is flowable but before curing of the resin, and wherein the resin is cured after the socket has been inserted to bond the contact surface to the surface of the conductive pad.

17. An interconnect socket as recited in claim 11, wherein the outer periphery of the mounting end section is formed with a plurality of rounded protrusions adapted to engage the walls of the hole at spaced points therearound when the socket is inserted in the hole.

18. An interconnect socket as recited in claim 17, wherein the protrusions comprise at least two spaced parallel annular rings extending generally perpendicular to the direction of insertion of the socket into the hole.

19. An interconnect socket having component parts capable of being assembled with a printed circuit substrate having a mounting hole in a planar surface of the substrate and a contact pad having a planar outer surface deposited on the same surface of the substrate in the vicinity of the hole, for providing electrical interconnection between the socket and the pad, the socket comprising:

a mounting section adapted to be inserted into the hole and having means for fastening the socket in the hole, the socket further having a contact section including spring contact means, extending outward from the periphery of the socket, and having generally planar contact surfaces for resiliently engaging the planar outer surface of the contact pad and making electrical contact with a substantial surface area portion thereof when the socket is fastened in the hole, the contact means comprising a U-shaped annular flange extending around the periphery of the socket and having a resilient contact leg for engaging the pad.

20. An interconnect socket as recited in claim 19, wherein the socket comprises a generally tubular spring-metal body member and the contact means comprises spring metal portions extending outward from the periphery of the socket member and having the planar contact surfaces for resiliently engaging the contact pad and making electrical contact therewith when the socket is fastened in the hole.

21. An interconnect socket as recited in claim 19, wherein the contact leg of the U-shaped flange is arranged at an angle to the contact pad, on insertion of the socket into the hole, so that an outer peripheral edge of the contact surface first engages the pad as the socket is inserted, and then the contact leg pivots toward the substrate to a substantially flat position fully engaging the pad when the socket has been fully inserted in the hole.

22. An interconnect socket as recited in any of claims 19, 20 or 21, for use with substrates having contact pads of a material that is deformable at the time of socket insertion, wherein the contact means on insertion compresses the pad and causes portions of the pad material to flow inwardly toward the center of the hole.

23. An interconnect socket as recited in claim 22, wherein the contact surface of the contact means is formed with parallel channels for receiving the material of the contact pad and permitting flow thereof along the contact means toward the center of the hole.

24. An interconnect socket as recited in claim 22, for use with contact pads formed of a mixture of conductive particles dispersed in a heat-curable thermosetting resin base, the particle-resin mixture being initially applied to the substrate as a flowable plastic paste and thereafter being heated to cure the resin base, wherein the socket is assembled with the substrate after the conductive paste has been applied and is flowable but before curing of the resin, and wherein the resin is cured after the socket has been inserted to bond the contact surface of the contact means to the surface of the conductive pattern.

25. An interconnect socket as recited in claim 24, for use with pads composed of silver particles in an epoxy or acrylic resin base, wherein at least the contact surface of the socket is plated with a noble metal or alloy.

26. An assembly comprising:

(a) a printed circuit board having a mounting hole in a planar surface of substrate and a conductive pattern having a planar outer surface deposited on the planar surface in the vicinity of the hole; and (b) an interconnect socket mounted in the hole and having spring means for resiliently gripping portions of the walls of the hole to fasten the socket in the hole, the socket further having spring contact means having generally planar contact surfaces for resiliently engaging the planar outer surface of the conductive pattern and making electrical contact with a substantial surface area portion thereof.

27. An assembly as recited in claim 26, wherein The socket comprises a generally tubular spring-metal body.

28. An assembly as recited in claim 26, wherein the conductive pattern is deformable at the time the socket is inserted into the hole, and wherein the contact means deforms portions of the conductive pattern on insertion of the socket into the hole.

29. An assembly comprising:

(a) a printed circuit board having a mounting hole in a planar surface of a substrate and a conductive pattern having a planar outer surface deposited on the planar surface in the vicinity of the hole; and (b) an interconnect socket mounted in the hole and having means for fastening the socket in the hole, the socket further having a midsection including spring contact means, extending outward from the periphery of the socket and having generally planar contact surfaces, for resiliently engaging portions of the planar outer surface of the conductive pattern and making electrical contact with a substantial surface area portion thereof when the socket is fastened in the hole.

30. A combination as recited in any of claims 1, 11, 19, 26, or 29, wherein the mounting hole is an unplated blind hole formed in the planar surface of the substrate.

31. A combination as recited in claim 30, wherein the conductive pattern or contact pad is a thick-film conductive material, and wherein the electrical contact between the contact surfaces and the conductive pattern or pad is a solder-free surface-bonded contact.

32. An assembly comprising:

(a) a printed circuit board having a mounting hole in a surface thereof and a flowable, heat-curable thick-film conductive pattern deposited on the surface in the vicinity of the hole; and (b) an interconnect member mounted in the hole and having means for fastening the member in the hole, the interconnect member further having a contact section including spring contact means for resiliently engaging and compressing portions of the flowable conductive pattern and making surface contact therewith when the interconnect member is fastened in the hole, the conductive pattern being heated to cure the pattern after the member has been inserted into the hole and to bond the contact means to the pattern.

33. An assembly as recited in claim 32, wherein the conductive pattern comprises a mixture of conductive particles dispersed in a heat-curable thermosetting resin base, the particle-resin mixture being initially applied to the substrate as a flowable plastic paste prior to insertion of the interconnect member in the hole.

34. An interconnect socket having component parts capable of being assembled with a printed circuit substrate having a mounting hole in a planar surface of the substrate and a contact pad of deformable material having a planar outer surface deposited on the same surface of the substrate in the vicinity of the hole, for providing electrical interconnection between the socket and the pad, the socket comprising:

a mounting section adapted to be inserted into the hole and having means for fastening the socket in the hole, the socket further having a contact section including spring contact means, extending outward from the periphery of the socket, and having generally planar contact surfaces for resiliently engaging the planar outer surface of the contact pad and making electrical contact with a substantial surface area portion thereof when the socket is fastened in the hole, wherein the contact means on insertion compresses the pad and causes portions of the pad material to flow inwardly toward the center of the hole.

35. An interconnect socket as recited in claim 34, wherein the contact surface of the contact means is formed with parallel channels for receiving the material of the contact pad and permitting flow thereof along the contact means toward the center of the hole.

36. An interconnect socket as recited in claim 34, for use with contact pads formed of a mixture of conductive particles dispersed in a heat-curable thermosetting resin base, the particle-resin mixture being initially applied to the substrate as a flowable plastic paste and thereafter being heated to cure the resin base, wherein the socket is assembled with the substrate after the conductive paste has been applied and is flowable but before curing the resin, and wherein the resin is cured after the socket has been inserted to bond the contact surface of the contact means to the surface of the conductive pattern.

37. An interconnect socket as recited in claim 36, for use with pads composed of silver particles in an epoxy or acrylic resin base, wherein at least the contact surface of the socket is plated with a noble metal or alloy.

* * * * *